United States Patent
Manohararajah et al.

(10) Patent No.: US 7,565,387 B1
(45) Date of Patent: Jul. 21, 2009

(54) SYSTEMS AND METHODS FOR CONFIGURING A PROGRAMMABLE LOGIC DEVICE TO PERFORM A COMPUTATION USING CARRY CHAINS

(75) Inventors: Valavan Manohararajah, Scarborough (CA); Chandra Shekar, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 817 days.

(21) Appl. No.: 11/134,978

(22) Filed: May 23, 2005

(51) Int. Cl.
*G06F 7/38* (2006.01)
(52) U.S. Cl. ....................................... 708/230
(58) Field of Classification Search .................. 708/230
See application file for complete search history.

(56) References Cited

U.S. PATENT DOCUMENTS

| | | | |
|---|---|---|---|
| 5,274,581 A | 12/1993 | Cliff et al. | |
| 6,359,468 B1 | 3/2002 | Park et al. | |
| 6,708,190 B1 * | 3/2004 | Jones et al. | 708/230 |
| 6,961,741 B2 * | 11/2005 | Swami | 708/235 |
| 7,164,288 B2 * | 1/2007 | Leijten-Nowak | 326/38 |
| 7,185,035 B1 * | 2/2007 | Lewis et al. | 708/235 |
| 2006/0097752 A1 * | 5/2006 | Bhatti et al. | 326/40 |

OTHER PUBLICATIONS

Stratix Device Handbook, vol. 1, Chapter 2, Altera Corporation, Sep. 2004.

* cited by examiner

*Primary Examiner*—Tan V Mai
(74) *Attorney, Agent, or Firm*—Ropes & Gray LLP

(57) ABSTRACT

The disclosed invention is a technology for configuring a programmable logic device to perform a computation using carry chains. A computation having multiple input values can be decomposed into sub-computations that have a few input values each. The sub-computations may be organized into a tree topology that includes a chain of sub-computations. The chain of sub-computations can be associated with a carry chain in the programmable logic device. Logic elements in the carry chain can be configured to perform the sub-computations using the carry chain logic in the logic elements.

19 Claims, 11 Drawing Sheets

SYSTEMS AND METHODS FOR CONFIGURING A PROGRAMMABLE LOGIC DEVICE TO PERFORM A COMPUTATION USING CARRY CHAINS

BACKGROUND OF THE INVENTION

This invention relates to performing computations having multiple input values using the logic elements of a programmable logic device, and, more particularly, to decomposing a large computation into sub-computations and performing the sub-computations using the carry chain logic of the logic elements.

Programmable logic devices have played and continue to play an important role in today's electronic devices and applications. The programmable logic device (PLD) bridges the spectrum between hardwired electronics on one end and fully programmable processor-based platforms on the other end. A PLD provides the benefits of both ends of the spectrum in that it provides more flexibility than a hardwired device and performs programmed operations without the complex architectural requirements of a processor-based system. Accordingly, there continues to be great interest in programmable logic devices.

In particular, computation delay in PLDs continues to be a topic of great interest. In computing architectures that use programmable logic and routing, the programming flexibility comes at the cost of slower computation speed. Some advances in PLD technology have been directed to improving the computation speed of particular types of operations. For example, U.S. Pat. No. 5,274,581 to Cliff et al., which is hereby incorporated herein by reference in its entirety, describes an improved PLD technology for quickly computing and communicating carry information for addition and counter operations. Using this technology, multiple PLD logic elements can be coupled together by their carry connections to allow carry information to quickly propagate from one logic element to another. This type of architecture is known as a "carry chain."

The concepts employed in a carry chain are also applicable to computations other than addition or counter operations. Since many computations are significantly more complicated and time consuming than addition or counter operations, there is interest in adapting carry chain concepts to performing general computations in a programmable logic device.

SUMMARY OF THE INVENTION

The disclosed invention is a technology for performing a computation that involves multiple input values using the carry chain logic in a programmable logic device.

In accordance with the disclosed technology, a computation that involves multiple input values can be decomposed into a tree of sub-computations. The decomposing technique can include factoring the computation and/or grouping the computation into sub-computations according to order of operations. The tree of sub-computations can include one or more chains of sub-computations, or the tree can be a single chain of sub-computations. The tree can include a primary chain of sub-computations and other chains that connect to the primary chain. The primary chain of sub-computations can correspond to the longest connection of sub-computations in the tree and/or to a timing critical path.

The chains of sub-computations can be associated with carry chains in a programmable logic device. A carry chain can include multiple logic elements that contain output computation logic and carry chain logic. A carry chain logic can contain one or more carry-in connections, one or more carry-out connections, a chain select connection, a chain select multiplexor, a carry-out multiplexor, and look-up tables (LUT) that are coupled to the carry-out multiplexor. An output computation logic can include an output multiplexor, an output connection, and LUTs that are coupled to the output multiplexor. A logic element can receive an input value from its general input connections or from the carry-in connections and chain select connection of its carry chain logic.

The logic elements that are associated with sub-computations can be configured to perform the sub-computations. In particular, the carry chain logic of a logic element can be configured to produce pre-computed values of the sub-computation associated therewith. A final logic element in the carry chain can be configured to perform a final sub-computation in the output computation logic of the final logic element.

In one embodiment, the computation's input values can be distinct from any carry-out values from other computations on the programmable logic device. One of the computation's input values can be coupled to a carry-in connection or a chain select connection in a starting logic element of an associated carry chain. Accordingly, a carry connection can be used to receive non-carry information.

Further features of the invention, its nature and various advantages will be more apparent from the accompanying drawings and the following detailed description of various embodiments.

DETAILED DESCRIPTION

The disclosed technology is an invention for configuring a programmable logic device (PLD) to perform a computation by decomposing the computation into sub-computations and performing the sub-computations using carry chain logic in the PLD.

Figure 1:
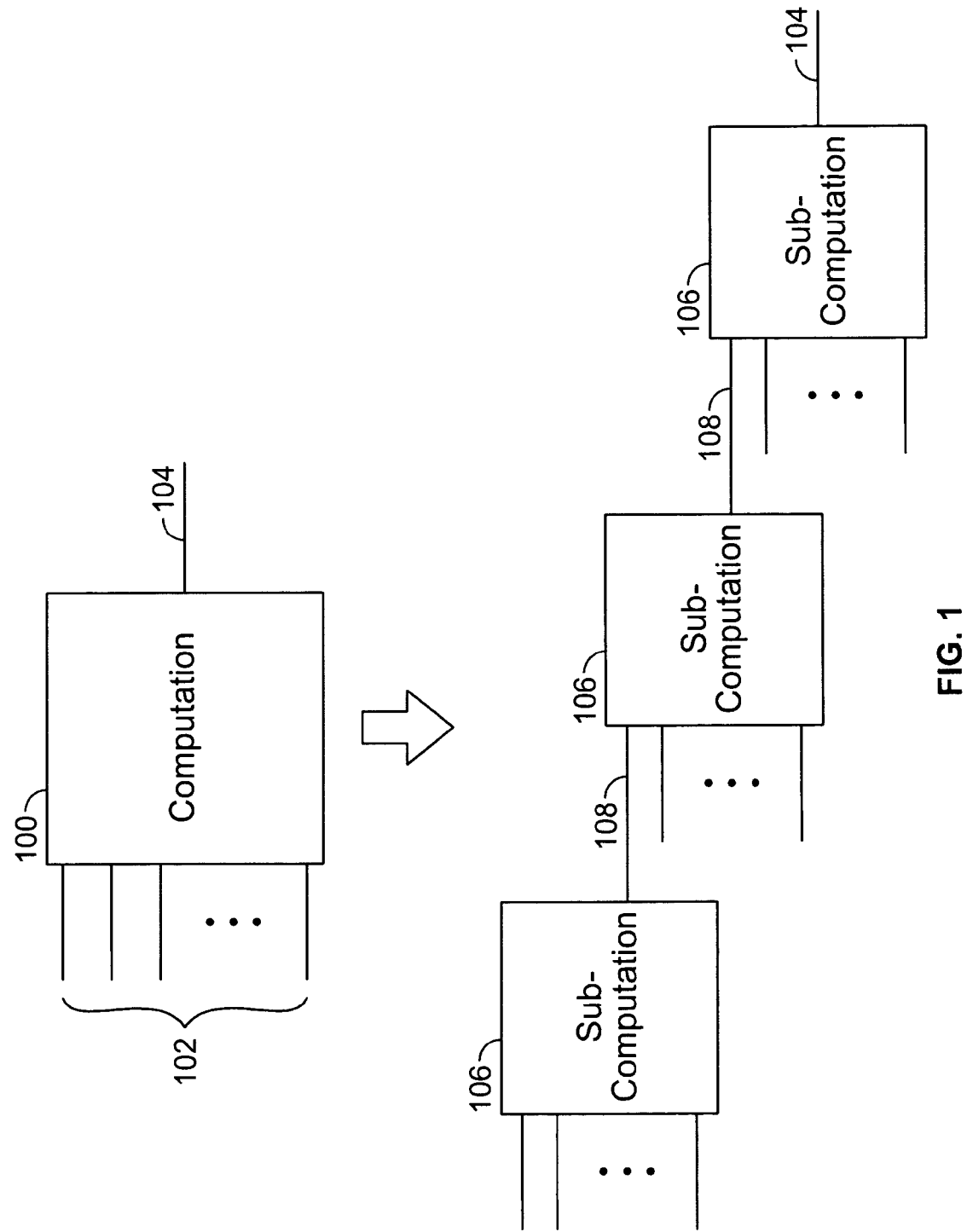
FIG. 1 is a diagram of a computation that has been decomposed into sub-computations.
Figure 2:
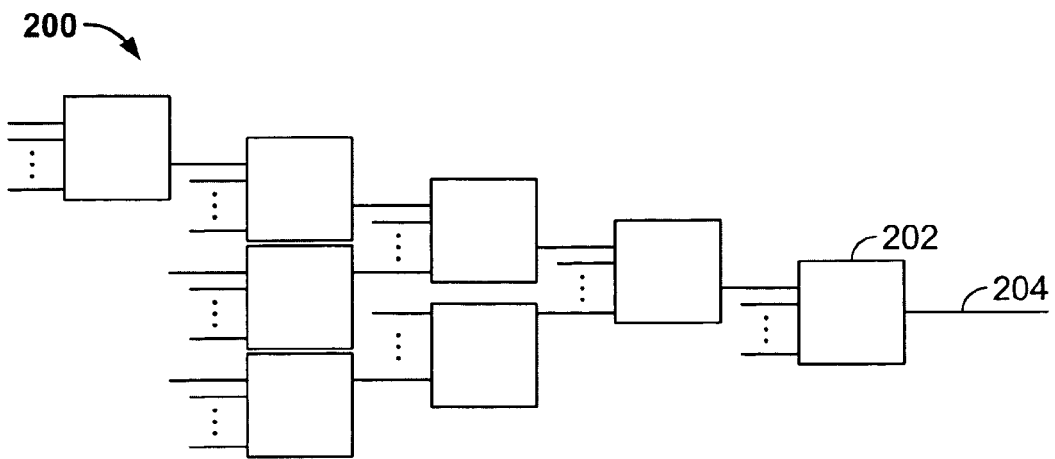
FIG. 2 is a diagram of an exemplary topology of sub-computations.

FIG. 1 shows a graphical representation of a computation 100 having multiple input values 102 and one output value 104. The output value 104 is computed based on some mathematical and/or algorithmic combination of the input values 102. Large computations having multiple inputs can contain units of sub-computations that can be performed sequentially in portions. For example, as shown in FIG. 1, the computation 100 may be capable of being represented as a chain of sub-computations 106, wherein some of the sub-computations produce intermediate values 108 that are used by other sub-computations. The output value produced by the final sub-computation in the chain is the resulting value 104 of the computation. A computation may not always be capable of being represented as a chain of sequential sub-computations. For example, as shown in FIG. 2, decomposition can result in a tree of sub-computations 200. However, even in cases where the topology of sub-computations is complex, the topology will include a final sub-computation 202 that produces the final computation result 204.

The process of representing a computation as a combination of sub-computations will be referred to herein as "decomposition." The simplest form of decomposition involves grouping a computation according to order of operations. For example, consider an illustrative Boolean computation that produces a resulting value Y based on four inputs D1, D2, D3, and D4, where $Y=(D_1+D_2) \cdot D_4+D_3 \cdot D_4$. For illustration purposes, suppose that each sub-computation can only include two input values. Accordingly, decomposing the computation according to order of operations results in four sub-computations: (1) compute $W_1=D_1+D_2$, (2) compute $W_2=W_1 \cdot D_4$, (3) compute $W_3=D_3 \cdot D_4$, and (4) compute $Y=W_2+W_3$. More effective decomposition techniques, such as factoring, may improve the decomposition process by allowing the number of sub-computations to be reduced. Factoring refers to the process of identifying common operations in different portions of a computation and re-organizing the computation to decrease the number of instances of the common operations. For example, consider again the computation $Y=(D_1+D_2) \cdot D_4+D_3 \cdot D_4$. Since the "and $D_4$" operation appears twice, the computation can be reorganized to become $Y=(D_1+D_2+D_3) \cdot D_4$. Decomposing this reorganized computation according to order of operations results in three sub-computations, which is an improvement over decomposing using order of operations alone. Thus, as this example illustrates, a large computation involving several input values can be decomposed into sub-computations that involve a few input values each by applying factoring and other decomposition techniques.

Figure 3:
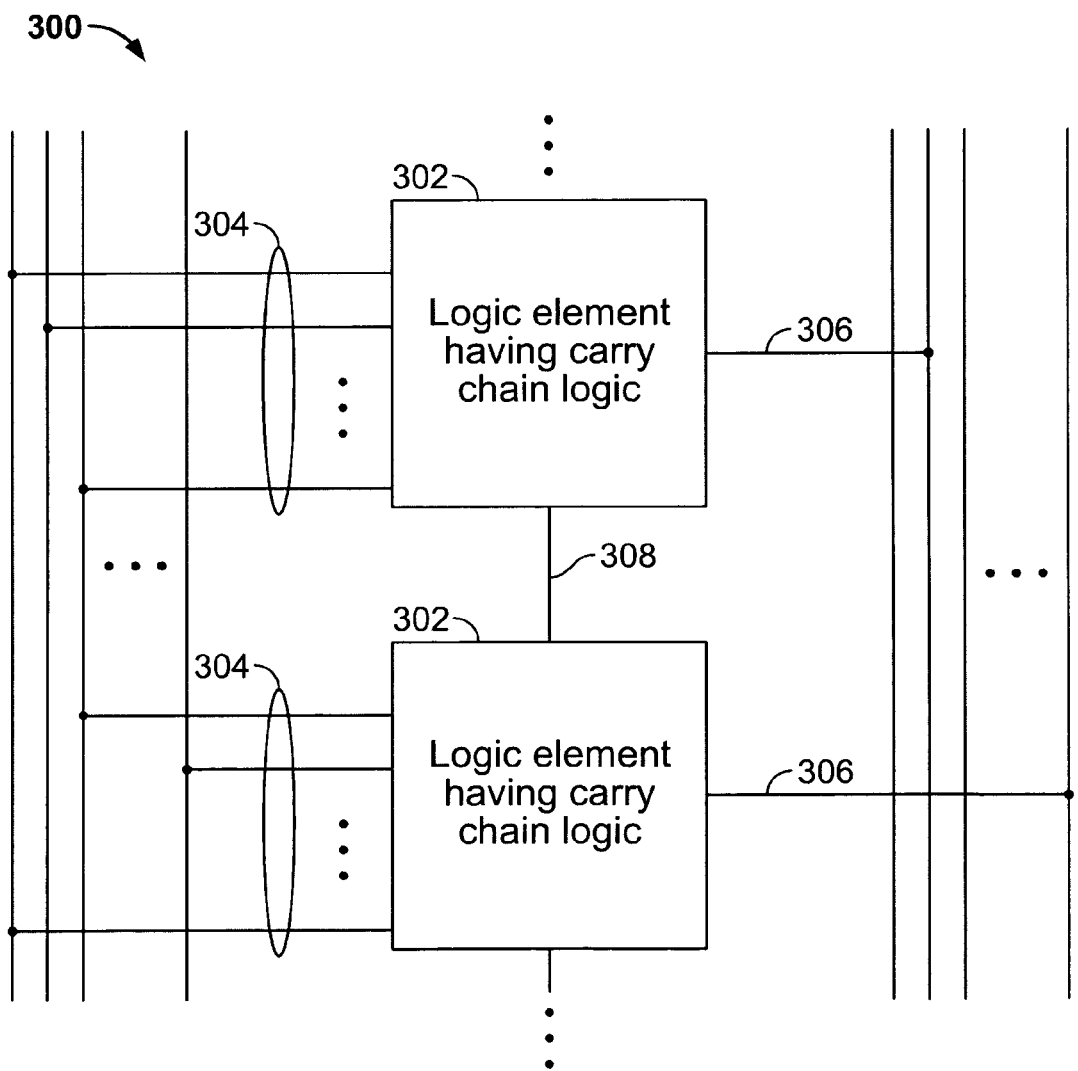
FIG. 3 is a schematic of a portion of an exemplary programmable logic device.

Decomposing a computation into sub-combinations may be necessary in cases where hardware and/or resource limitations prevent a large computation from being completed together. Such limitations may exist, for example, in programmable logic environments in which computations are performed by computation units that handle a few input values each. FIG. 3 shows two exemplary logic elements 302 in a programmable logic device (PLD) 300, where the logic elements are coupled to various connections. The connections include input connections 304, output connections 306, and carry connections 308. It is common for a logic element to include four to eight input connections, but a logic element may be limited to using a subset of these connections when operating in certain modes. Therefore, computations that involve a large number of input values may need to be decomposed into sub-computations based on the constraints and limitations associated with particular logic elements. Programmable logic devices and logic elements are described, for example, in U.S. Pat. No. 5,260,611 to Cliff et al., which is hereby incorporated herein by reference in its entirety.

It is common for logic elements to include programmable look-up tables. One innovative development in PLD technology recognizes that logic elements may often be used for addition or counter operations that involve carry-bit calculations, and single look-up table architectures may be inefficient for handling such operations. Accordingly, it is also common for logic elements to include specialized architectures for computing and communicating carry information. As previously mentioned herein, one carry technology is described in U.S. Pat. No. 5,274,581 to Cliff et al.

Figure 4:
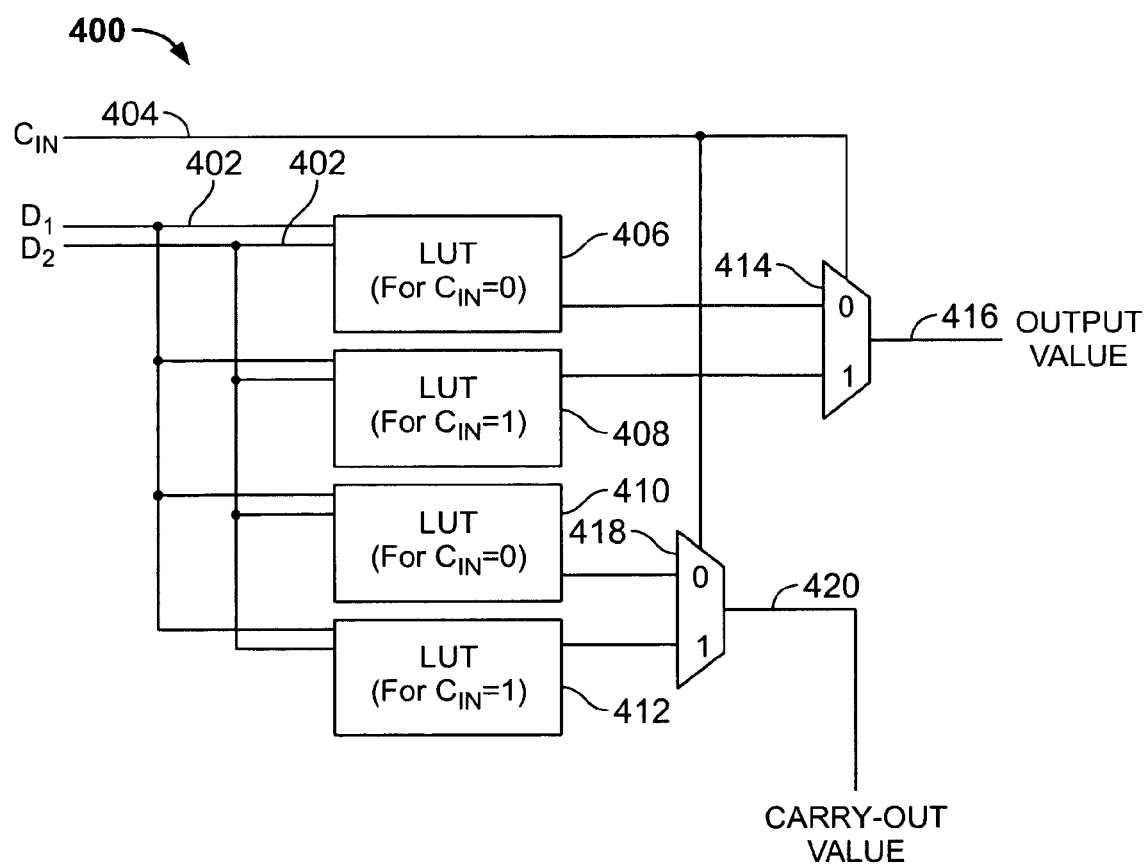
FIG. 4 is a block diagram of one embodiment of a logic element that includes carry chain logic.

FIG. 4 shows one example of a logic element architecture 400 that includes carry logic and carry connections. The illustrated architecture contains two input connections 402, one carry-in connection 404, four look-up tables (LUT) 406-412, an output multiplexor 414, an output connection 416, an carry-out multiplexor 418, and a carry-out connection 420. The logic element 400 receives a carry-in value $C_{IN}$ on the carry-in connection 404 and data values $D_1$ and $D_2$ on the input connections 402. The upper two LUTs 406,408 are configured to compute an output value, and the lower two LUTs 410,412 are used to compute a carry-out value.

The illustrated architecture 400 includes a pre-carry computation capability that allows the LUTs to pre-compute the output value and the carry-out value before the carry-in value is available. For example, suppose the output value is derived by a sub-computation that is based on $D_1$, $D_2$, and $C_{IN}$. When data values $D_1$ and $D_2$ are available, the first LUT 406 can perform the sub-computation based on $D_1$ and $D_2$ and based on anticipating that $C_{IN}$ will be zero. The second LUT 408 can perform the sub-computation based on $D_1$ and $D_2$ and based on anticipating that $C_{IN}$ will be one. The results of these pre-computations are made available to the output multiplexor 414. When the carry-in value becomes available, the output multiplexor 414 couples one or the other of the two pre-computed output values to the output connection 416 based on whether $C_{IN}$ is zero or one. Accordingly, a logic element 400 need not wait for the carry-in value to be available before performing the LUT sub-computations. The same pre-carry computation capability is also useful for computing the carry-out value. One LUT 410 pre-computes the carry-out value based on anticipating that $C_{IN}$ will be zero, and the other LUT 412 pre-computes the carry-out value based on anticipating that $C_{IN}$ will be one. When the carry-in value becomes available, the carry-out multiplexor 418 couples one or the other of the two pre-computed carry-out values to the carry-out connection 420 based on whether $C_{IN}$ is zero or one. The carry-out connection 420 can be a dedicated, fast connection that communicates the carry-out value directly to the carry-in connection of another logic element.

With continuing reference to FIG. 4, the pre-carry computation capability is particularly powerful when multiple logic elements that are interconnected by carry connections and carry information is pre-computed and propagated through the carry connections. In such an architecture, the collective carry-in connections 404, carry-out connections 420, and carry-out multiplexors 418 of the interconnected logic elements will be referred to herein as a "carry chain." Further, a logic element 400 will be referred to herein as being "in" or "part of" a carry chain when that logic element contains carry connections 404,418,420 that are part of the carry chain. Also "carry chain logic" will refer to the portion of logic in a logic element that belongs to a carry chain and will also include the LUTs 410,412 coupled to the carry-out multiplexor 418. The pre-carry computation capability allows each logic element in a carry chain to pre-compute carry-out values before the carry-in value in the first logic element of the carry chain becomes available. Then, when the carry-in value in the first logic element becomes available, the logic elements in the carry chain can sequentially receive a carry-in value from an upstream logic element and, based on the carry-in value, communicate one of the pre-computed carry-out values to a downstream logic element. Based on a received carry-in value, the final logic element in the carry chain can couple a pre-computed output value to its output connection to complete the computation. Accordingly, assuming that pre-computations have been completed, the delay from the time a carry-in value becomes available at the first logic element in a carry chain to the time a pre-computed output value is selected at the final logic element in the carry chain can be determined entirely by signal propagation and multiplexor selection delays along the carry chain.

In some situations, it may not be possible for the logic elements to complete pre-computations before a carry-in value becomes available at the first logic element. Referring again to FIG. 4, in one embodiment, a carry-out multiplexor 418 can operate by coupling one of its inputs to the carry-out connection 420 when the carry-in value is received. The carry-out multiplexor 418 can maintain this coupling indefinitely to allow the LUTs 410,412 to complete their "pre-computation" of the carry-out value. When the carry-out value becomes available, it can be coupled through the carry-out multiplexor 418 to the carry-out connection 420, where it can propagate to the next logic element. In this situation, the delay from the time the carry-in value becomes available at the first logic element in a carry chain to the time the correct pre-computed output value is selected at the final logic element in the carry chain is increased by any LUT computation delays along the carry chain.

Figure 5:
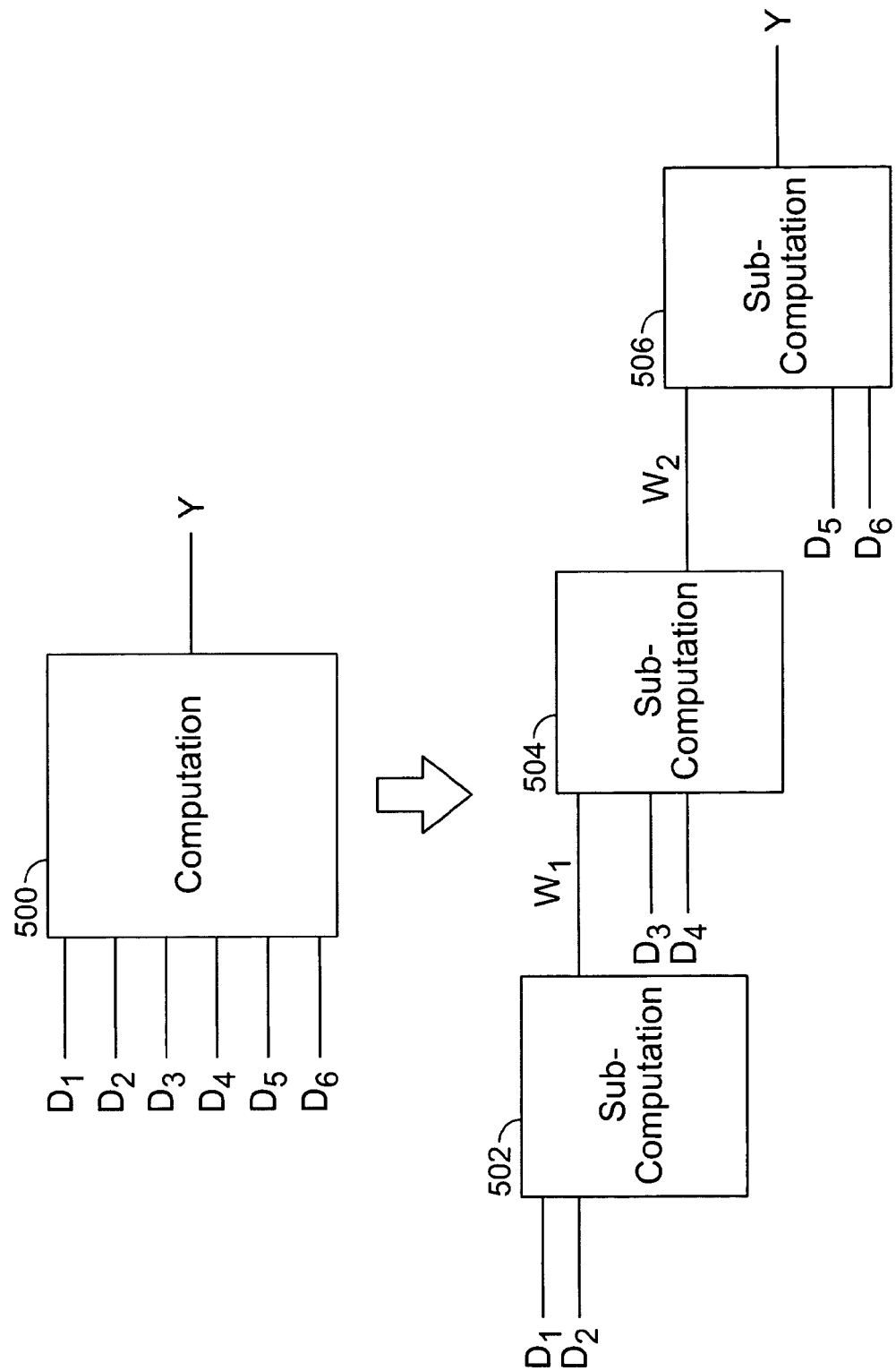
FIG. 5 is a diagram of a computation that has been decomposed into a chain of three sub-computations.

Carry chains have typically been used only for counter or addition operations that involve carry information. However, the LUTs that compute carry-out values can be programmed to perform computations other than carry computations. By decomposing a computation into one or more chains of sub-computations and programming logic elements to perform those sub-computations, computations other than counter or addition operations can also utilize the carry chain architecture. For example, consider a computation 500 that produces a resulting value Y based on six input values $D_1, D_2, D_3, D_4, D_5$, and $D_6$. For purposes of illustration, suppose that the computation 500 can be decomposed into a chain of three sub-computations 502-506 as shown in FIG. 5. Using a carry architecture to compute the sub-computations 502-506, $W_1$ and $W_2$ can be computed as the carry-out values of a first and a second logic element, respectively, and Y can be computed as the output value of a final logic element. The following paragraphs will describe embodiments for configuring the logic elements in a carry chain to perform the sub-computations 502-506. It will be assumed that data signal D1 in the first logic element will be the last data signal to become available.

Figure 6:
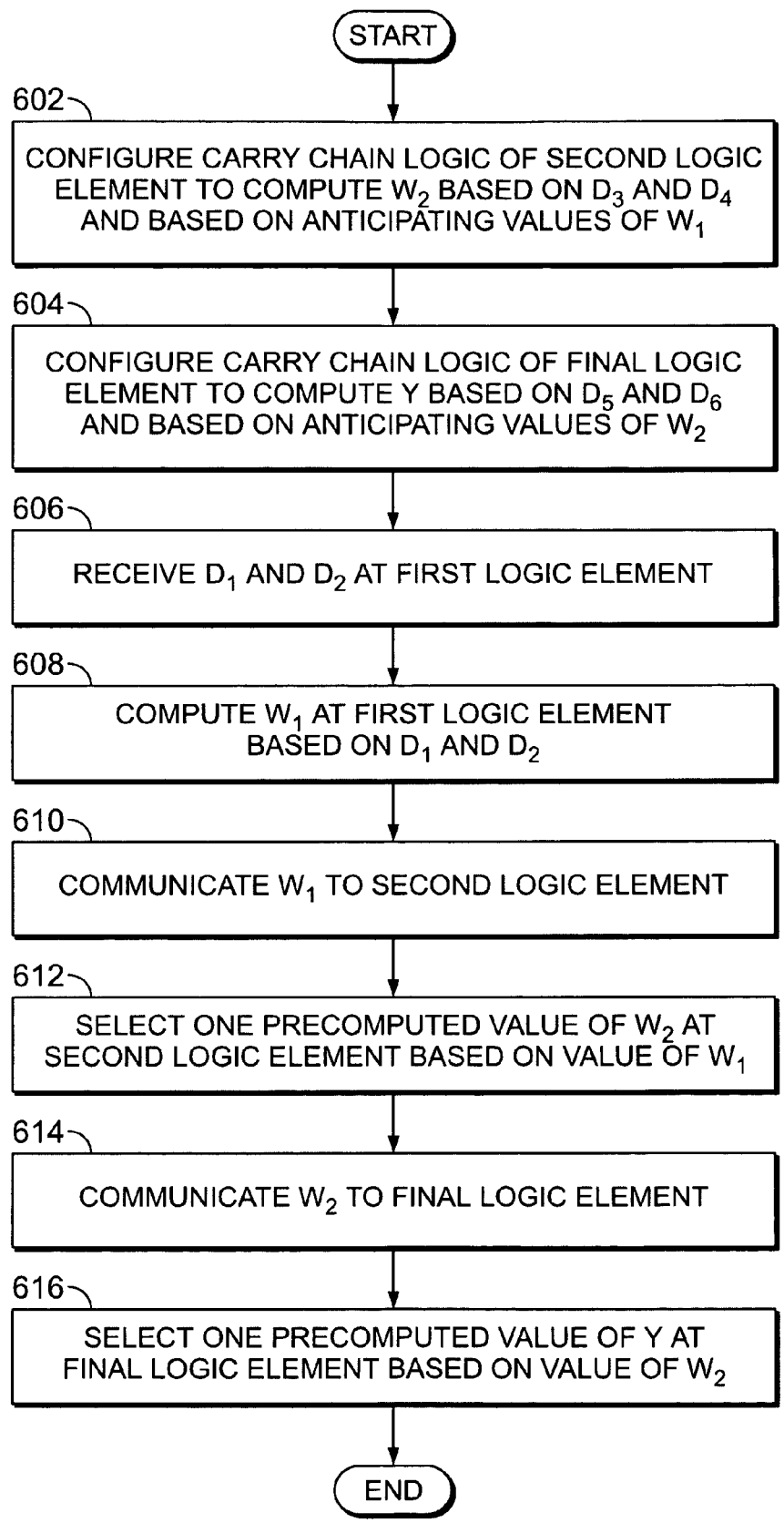
FIG. 6 is a flow diagram directed to configuring a programmable logic device to perform the sub-computations of FIG. 5.

FIG. 6 is a flow diagram illustrating a method of configuring logic elements to perform the sub-computations shown in FIG. 5. Since there are three sub-computations, three corresponding logic elements in a carry chain can be used to perform the sub-computations. The first logic element can be configured to receive $D_1$ and $D_2$ on its input connections. Since the first logic element will not receive a carry-in value, it can arbitrarily set the carry-in value to zero to configure the carry-out multiplexor to couple one of the LUTs to the carry-out connection. That LUT can be configured to compute $W_1$ based on $D_1$ and $D_2$. The second logic element can be configured to receive $D_3$ and $D_4$ on its input connections. It can be configured to pre-compute values for $W_2$ based on $D_3$ and $D_4$ and based on anticipating that $W_1$ can be either zero or one 602. The final logic element can be configured to receive $D_5$ and $D_6$ at its input connections. It can be configured to pre-compute values for Y based on $D_5$ and $D_6$ and based on anticipating that $W_2$ can be either zero or one 604.

When $D_1$ and $D_2$ become available 606 at the first logic element, $W_1$ can be computed based on $D_1$ and $D_2$ 608 and can be communicated to the second logic element on the carry-out connection 610. Since the values of $W_2$ have been pre-computed, the value of $W_1$ can be used to select one of the pre-computed values of $W_2$ 612, and the value of $W_2$ can be communicated to the final logic element on the carry-out connection 614. Similarly, since the values of Y have been pre-computed, the value of $W_2$ can be used to select one of the pre-computed values of Y to complete the computation 616.

Figure 7:
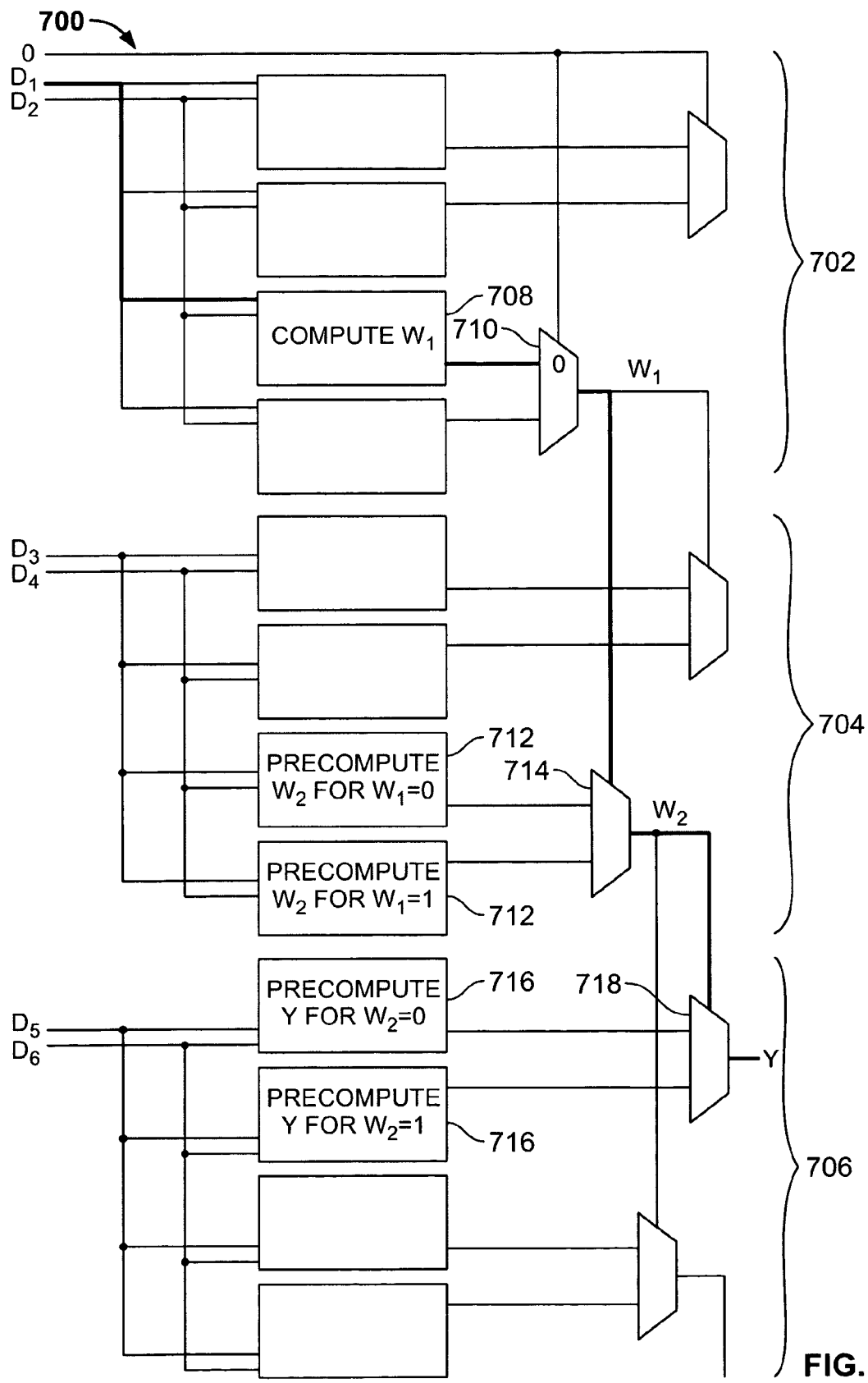
FIG. 7 is a block diagram of logic elements that are configured in accordance with FIG. 6.

These configurations are shown in logic element diagram 700 of FIG. 7. In the first logic element 702, one LUT 708 coupled to the carry-out multiplexor 710 is configured to compute $W_1$ based on $D_1$ and $D_2$. In the second logic element 704, the LUTs 712 coupled to the carry-out multiplexor 714 are configured to compute $W_2$ based on $D_3$ and $D_4$ and anticipated values of $W_1$. In the final logic element 706, the LUTs 716 coupled to the output multiplexor 718 are configured to compute Y based on $D_5$ and $D_6$ and anticipated values of $W_2$. The emphasized path through the logic elements traces the path through which the relevant signals propagate to produce the final value Y and is referred to herein as the "propagation path." The propagation path in the embodiment of FIG. 7 includes an LUT computation 708, two carry-out multiplexors 710,714, and one output multiplexor 718.

Figure 8:
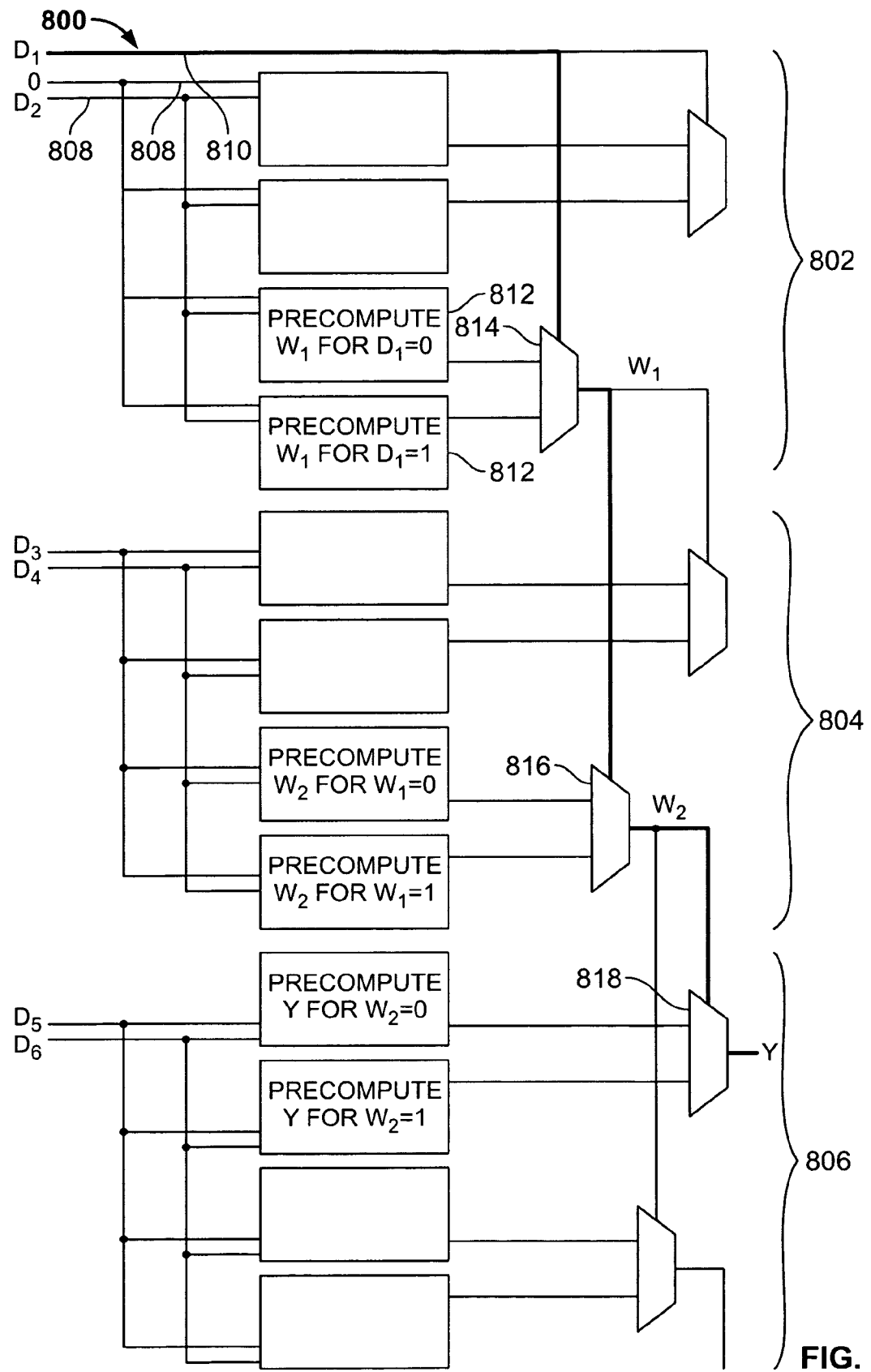
FIG. 8 is a block diagram of another embodiment of logic elements that are configured to perform the sub-computations of FIG. 5.

In another embodiment shown in FIG. 8, the configuration of the second logic element 804 and the final logic element 806 are the same those shown in FIG. 7. The difference is in the configuration of the first logic element 802. Rather than receiving both $D_1$ and $D_2$ at the input connections 808, the first logic element 802 receives $D_1$ at the carry-in connection 810. The LUTs 812 coupled to the carry-out multiplexor 814 can be configured to pre-compute values of $W_1$ based on $D_2$ and based on anticipating that $D_1$ will be zero or one. The unused input connection can be set to zero. As shown in FIG. 8, if $D_1$ is the last data value to become available, the propagation path in this embodiment can include two carry-out multiplexors 814,816 and one output multiplexor 818.

Figure 9:
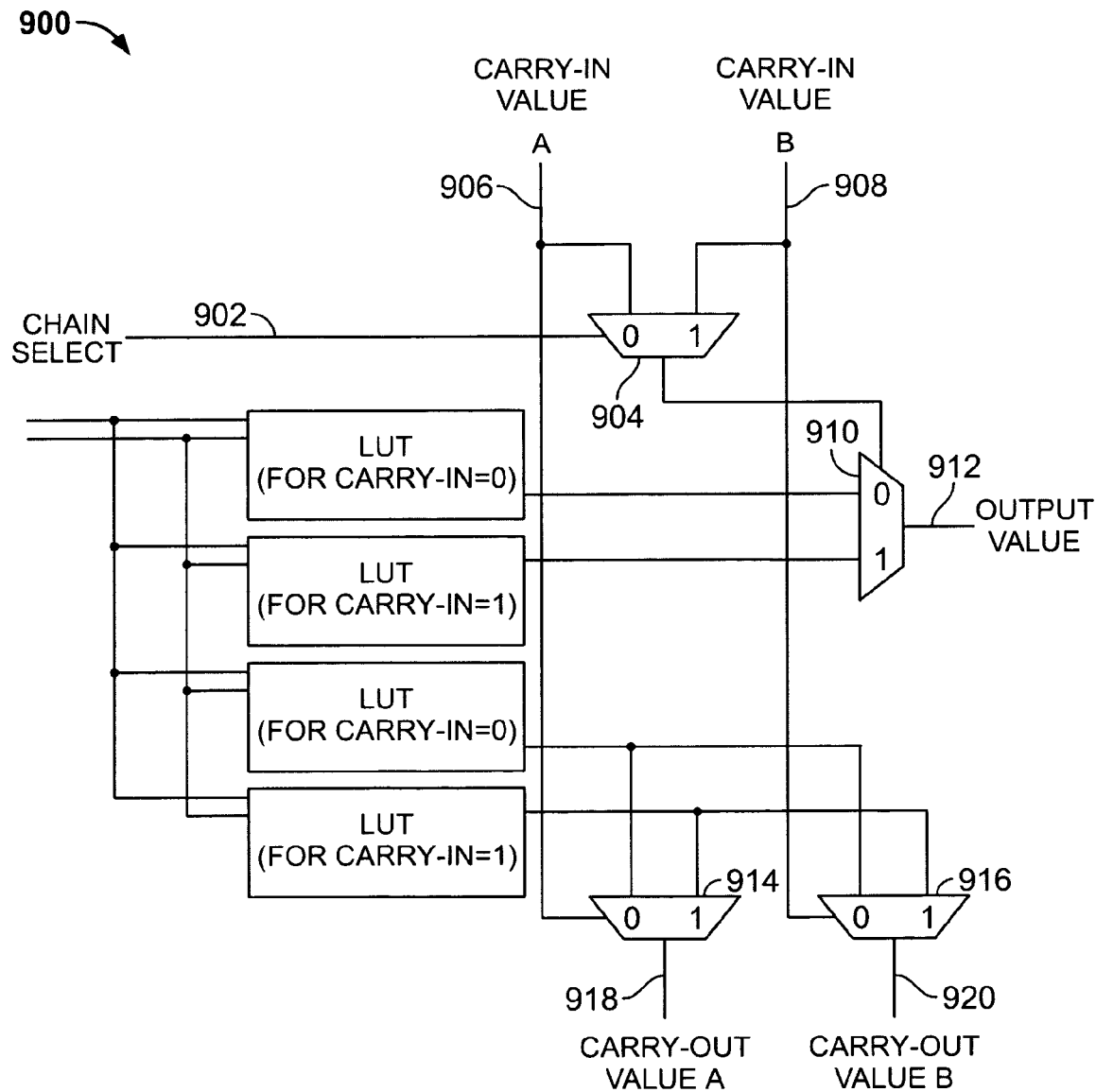
FIG. 9 is a block diagram of another embodiment of a logic element that includes carry chain logic.

Referring now to FIG. 9, there is shown a logic element architecture 900 having two carry chains rather than one. This logic element architecture is described in U.S. Pat. No. 6,359,468 to Park et al., which is hereby incorporated herein by reference in its entirety. The illustrated architecture includes a chain select connection 902 that allows a chain select multiplexor 904 to select either the carry-in value from carry-in connection A 906 or the carry-in value from carry-in connection B 908. The output multiplexor 910 uses the selected carry-in value to couple a pre-computed output value to the output connection 912. The two carry-in connections 906,908 also connect to two output multiplexors 914,916, which couple pre-computed carry-out values to the carry-out connections 918,920. In one embodiment, the chain select connection 902 is shared among multiple logic elements in a carry chain so that the same carry-in connection (i.e., carry-in connection A or carry-in connection B) is used by the logic elements in the same carry chain. The benefit of this architecture will become clear during the description of the subsequent figures.

Figure 10:
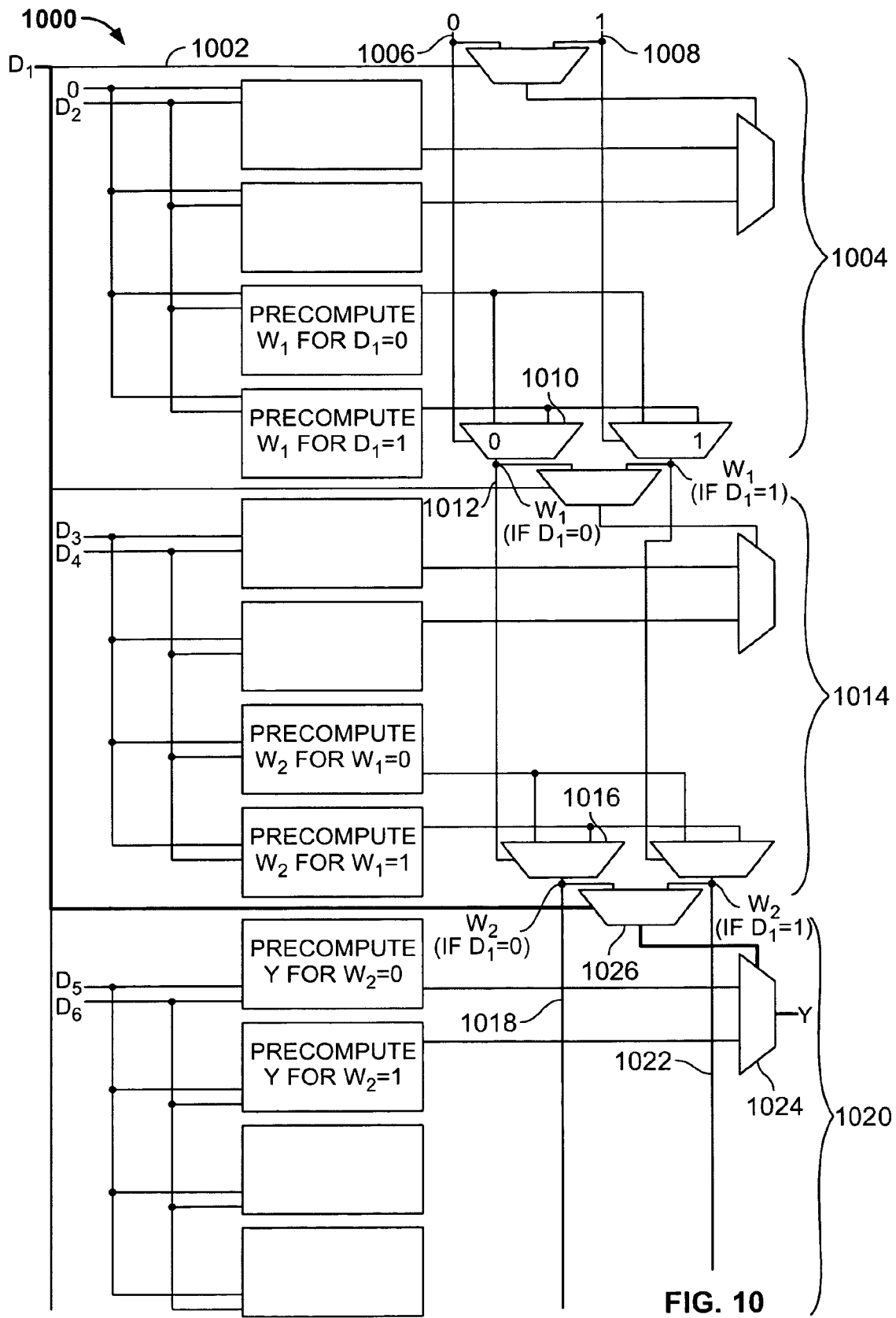
FIG. 10 is a block diagram of another embodiment of logic elements that are configured to perform the sub-computations of FIG. 5.

FIG. 10 shows another embodiment of logic elements that are configured to perform the sub-computations of FIG. 5. The LUTs and input connections of the logic elements can be configured in the same way as shown in FIG. 8, except $D_1$ will be coupled to the chain select connection 1002 rather than to a carry-in connection. The first logic element 1004 does not receive carry-in values, so the carry-in values for carry-in connection A 1006 and carry-in connection B 1008 are set to zero and one, respectively. This assignment of values is not arbitrary, however. With respect to carry-in connection A 1006, the carry-in value of zero will direct carry-out multiplexor A 1010 to couple the value of $W_1$ that was pre-computed based on $D_1$=0 to carry-in connection A 1212 in the second logic element 1014. Using this value of $W_1$, the second logic element 1014 will direct its carry-out multiplexor A 1016 to couple one of the pre-computed values of $W_2$ to carry-in connection A 1018 in the final logic element 1020. The final logic element 1020 will have, at carry-in connection A 1018, the value of $W_2$ based on anticipating that $D_1$ will be zero. Similarly, the final logic element 1020 will also have, at carry-in connection B 1022, the value of $W_2$ based on anticipating that $D_1$ will be one. In addition, the final logic element 1020 will also have pre-computed values of Y based on $W_2$ being zero or one. Since the value of $D_1$ on the chain select connection 1002 does not affect the carry-out multiplexor selections in the first and second logic elements, the illustrated carry architecture allows the output multiplexor 1024 in the final logic element 1020 to make a selection based solely on the value of $D_1$ on the chain select connection 1002. When $D_1$ becomes available on the chain select connection 1002, the chain select multiplexor 1026 in the final logic element 1020 can select carry-in connection A 1018 or carry-in connection B 1022 based on whether $D_1$ is zero or one. The carry-in value of the selected carry-in connection will be the correct value of $W_2$, and the output multiplexor 1024 can select one or the other pre-computed value of Y based on whether $W_2$ is zero or one. Accordingly, if $D_1$ is the last data value to become available, the propagation path in this embodiment can include just one chain select multiplexor 1026 and one output multiplexor 1024.

Figure 11:
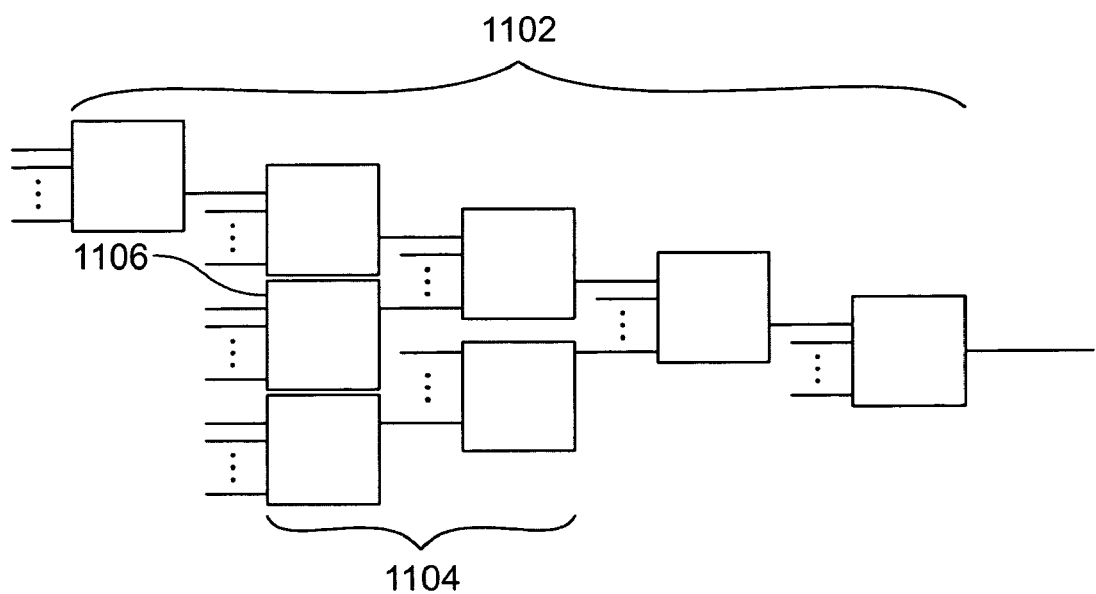
FIG. 11 is a diagram of one exemplary topology of sub-computations that includes multiple chains of sub-computations.

What has been described thus far in connection with FIGS. 3-10 are exemplary embodiments of the disclosed technology. In general, decomposing a computation involving a large number of input values may result in a complex topology of sub-computations, rather than a single chain of sub-computations as shown in FIG. 5. However, even in such cases, it will be possible to identify in the topology a primary chain that corresponds to the longest connection of sub-computations in the topology, as shown in FIG. 11. The topology may also contain other chains of sub-computations 1104 that branch into the primary chain 1102. In addition, the topology may also contain single sub-computations 1106 that do not belong to any chains. The primary chain 1102 and each of the other chains of sub-computations 1104 can be computed using a corresponding carry chain in a programmable logic device.

In one embodiment, a primary chain of sub-computations can correspond to a path of sub-computations in the tree that may be processed slower than is desirable in view of system timing requirements and/or a path whose signals affect overall system timing. Such a path may be referred to as a "timing critical" path. A timing critical path may coincide with the longest connection of sub-computations in the tree but is not limited to the longest connection of sub-computations. A timing critical path can be identified, for example, by software analysis tools that analyze signal timing in view of system timing requirements.

A logic element in accordance with the disclosed technology can contain carry connections and components that implement a pre-carry computation capability. The pre-carry computation capability can be implemented using a programmable logic array, a memory cell, an arithmetic logic unit, a processor, or another computation structure. A carry connection can include a multiplexor or another well-known switching device. A logic element can contain multiple carry-in connections and multiple chain select connections. Accordingly, a logic element can contain the exemplary structures of FIG. 4 and FIG. 9 but is not limited by such exemplary structures. The carry connections from multiple logic elements can be coupled together to form a carry chain.

Figure 12:
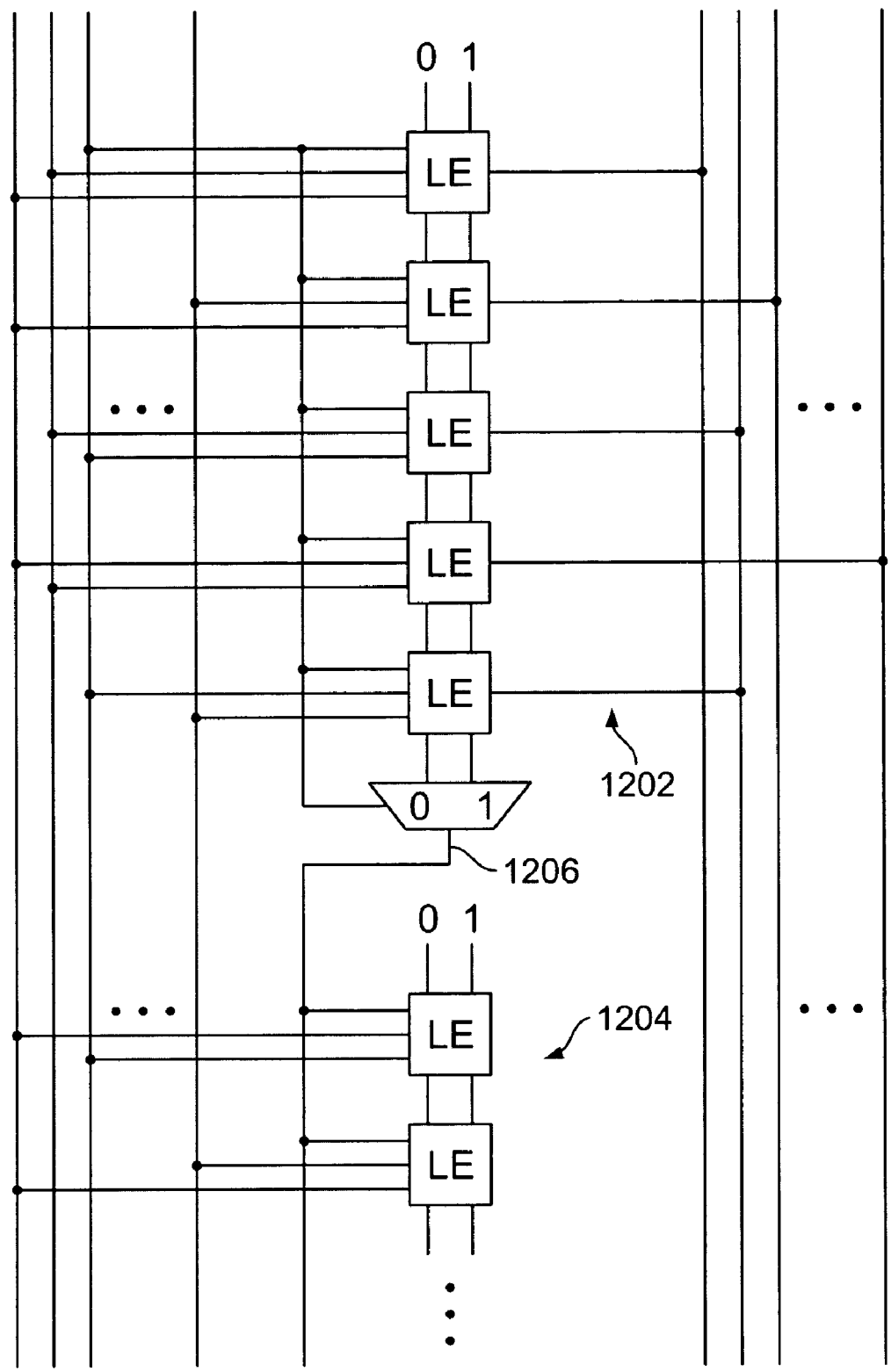
FIG. 12 is a block diagram of a carry chain that includes a predetermined number of logic elements.

In one embodiment, a carry chain can include a predetermined number of logic elements, such as five logic elements, as shown in FIG. 12. In some cases, it is possible for the number of sub-computations in a chain of sub-computations to exceed the number of logic elements in a carry chain. In such cases, the chain of sub-computations can span more than one carry chain 1202,1204. The carry chains 1202,1204 can be connected by a dedicated, fast carry connection 1206 or by routable connections (not shown). The different carry chains 1202,1204 need not be configured the same way. For example, first carry chain 1202 can be configured so that its propagation path includes the carry-in and carry-out connections of the logic elements (such as the configuration of FIG. 8), and the second carry chain 1204 can be configured so that its propagation path includes the chain select connection (such as the configuration of FIG. 10).

The process of decomposing a computation into sub-computations, assigning the sub-computations to logic elements, and configuring the logic elements to perform the sub-computations, can be performed by software instructions operating on a computer or on another suitable computing device or platform. Since some decomposition techniques may be difficult for a computer to apply, the decomposition process can be performed in whole or in part by humans. It some cases, the other portions of this process can also be performed by humans.

Accordingly, what has been described are systems and methods for configuring a programmable logic device to perform a computation using carry chain logic. One skilled in the art will appreciate that any embodiment described and/or illustrated herein is exemplary and does not limit the scope of the invention as defined by the following claims.

What is claimed is:

1. A method of configuring a programmable logic device to perform a computation, where the programmable logic device contains logic elements connected in a carry chain, the method comprising:
   decomposing a computation into a tree of sub-computations;
   identifying a chain of sub-computations in the tree of sub-computations;
   associating the chain of sub-computations with a carry chain; and
   configuring the logic elements in the carry chain of the programmable logic device to perform the chain of sub-computations using carry chain logic in the logic elements.

2. The method of claim 1, wherein the tree of sub-computations is a single chain of sub-computations.

3. The method of claim 1, wherein decomposing the computation comprises at least one of: factoring the computation and grouping the computation into sub-computations according to order of operations.

4. The method of claim 1, wherein identifying a chain of sub-computations includes identifying a primary chain of sub-computations.

5. The method of claim 4, wherein the primary chain of sub-computations corresponds to at least one of a longest connection of sub-computations in the tree of sub-computations and a timing critical path of sub-computations in the tree of sub-computations.

6. The method of claim 4, further comprising:
identifying at least one other chain of sub-computations, where the at least one other chain of sub-computations connects to the primary chain of sub-computations.

7. The method of claim 6, further comprising:
associating the at least one other chain of sub-computations with a corresponding at least one other carry chain.

8. The method of claim 7, further comprising:
coupling an output connection of a logic element in the corresponding at least one other carry chain to one of an input connection, a carry-in connection, and a chain select connection in a logic element in the primary carry chain.

9. The method of claim 1, wherein the carry chain logic in the logic elements comprises at least one of: carry-in connections, carry-out connections, chain select connections, chain select multiplexors, carry-out multiplexors, and look-up tables coupled to the carry-out multiplexors.

10. The method of claim 1, wherein configuring logic elements in the carry chain includes configuring carry chain logic in at least one of the logic elements to produce pre-computed carry-out values for at least one sub-computation in the chain of sub-computations.

11. The method of claim 1, further comprising:
configuring a final logic element in the carry chain to perform a final sub-computation in the chain of sub-computations using output value computation logic in the final logic element.

12. The method of claim 1, further comprising:
configuring a starting logic element in the carry chain to receive input values from at least one of an input connection, a carry-in connection, and a chain select connection.

13. A method of configuring a programmable logic device to perform a computation, where the programmable logic device contains logic elements connected in a carry chain, the method comprising:
decomposing a computation having a plurality of input values into a chain of sub-computations, where the plurality of input values are distinct from carry-out values from other computations in the programmable logic device;
associating a starting logic element in a carry chain of the programmable logic device with a starting sub-computation in the chain of sub-computations; and
configuring the programmable logic device to perform a computation by configuring the starting logic element to receive one of the plurality of input values on one of a carry-in connection and a chain select connection of the starting logic element.

14. The method of claim 13, wherein the starting logic element is disconnected from carry-out connections associated with the other computations in the programmable logic device.

15. The method of claim 13, further comprising:
configuring carry chain logic in the starting logic element to produce pre-computed carry-out values for the starting sub-computation.

16. A programmable logic device configured to perform a computation, comprising:
a carry chain that is associated with a chain of sub-computations decomposed from a computation having a plurality of input values, where the plurality of input values are distinct from carry-out values from other computations in the programmable logic device; and
a starting logic element in the carry chain that is associated with a starting sub-computation in the chain of sub-computations, said starting logic element including at least one of a carry-in connection and a chain select connection,
where one of the plurality of input values is coupled to one of the carry-in connection and the chain select connection.

17. The programmable logic device of claim 16, further comprising:
at least one other logic element in the carry chain that is associated with at least one corresponding sub-computation in the chain of sub-computations, where the at least one other logic element is configured to perform the at least one corresponding sub-computation in a carry chain logic of the at least one other logic element.

18. The programmable logic device of claim 17, further comprising:
a final logic element in the carry chain that is associated with a final sub-computation in the chain of sub-computations, where the final logic element is configured to perform the final sub-computation in an output computation logic of the final logic element.

19. A machine readable medium having stored thereon sequences of instructions, the sequences of instructions including instructions which, when executed by a processor, cause the processor to configure a programmable logic device to perform a computation, the configuring by the processor comprising:
decomposing a computation into a tree of sub-computations;
identifying a timing critical path of sub-computations in the tree of sub-computations;
associating sub-computations in the timing critical path with a carry chain; and
configuring logic elements in the carry chain to perform the sub-computations in the timing critical path using carry chain logic in the logic elements.

\* \* \* \* \*